United States Patent [19]
Kawakami

[11] Patent Number: 5,256,442
[45] Date of Patent: Oct. 26, 1993

[54] SCREEN PRINTING METHOD FOR FORMING A MULTIPLICITY OF PRINTED WIRING BOARDS

[75] Inventor: Shin Kawakami, Saitama, Japan

[73] Assignee: Nippon CMK Corp., Japan

[21] Appl. No.: 851,826

[22] Filed: Mar. 16, 1992

[30] Foreign Application Priority Data

Mar. 20, 1991 [JP] Japan .................................. 3-081482

[51] Int. Cl.$^5$ .............................................. B05D 5/12
[52] U.S. Cl. ...................... 427/96; 427/272; 427/275; 427/282; 101/129
[58] Field of Search ............... 430/315; 427/282, 275, 427/293, 272, 96; 29/846; 101/129

[56] References Cited

U.S. PATENT DOCUMENTS 2,755,196  7/1956  Scholl ............................ 427/272 X
4,123,572  10/1978 Gidley ............................ 427/272
4,437,140  3/1984  Ohyama et al. .................. 427/96 X Primary Examiner—Terry J. Owens
Attorney, Agent, or Firm—Bruce L. Adams; Van C. Wilks

[57] ABSTRACT

Method to form a photosensitive ink film having an even thickness over the entire surface of a broad plate material capable of obtaining a multiplicity of printed wiring boards. An emulsion pattern 4 is provided on a screen 3 on which a squeegee travels. The pattern 4 is formed correspondingly to a cutting spaces of a plate material for the purpose of obtaining a multiplicity of printed wiring boards. When a photosensitive ink is forced onto the broad plate material through a screen 3 for a screen printing, the photosensitive ink is dispersed by the pattern 4, thereby forming a film of even thickness over the entire surface of the plate material not corresponding to the emulsion pattern.

20 Claims, 2 Drawing Sheets

SCREEN PRINTING METHOD FOR FORMING A MULTIPLICITY OF PRINTED WIRING BOARDS

BACKGROUND OF THE INVENTION

1. Field of the Invention

The present invention relates to a film forming method in which a photosensitive ink film is formed by screen printing onto a plate material during the manufacture of printed wiring boards.

2. Description of the Related Arts

FIG. 3 illustrates a screen printing step in the process of manufacturing printed wiring boards. A screen 33 is tensed against a substrate 30 which includes an insulating plate 31 laminated with a copper foil 32, and a squeegee 34 slides across the screen 33. A photosensitive ink 35 which is supplied in front of the squeegee 34 drops through the screen 33 as the squeegee 34 slides across the screen 33 in the direction of the arrow, thereby forming a photosensitive ink film 36 over the entire surface of the substrate 30. After the formation of the photosensitive ink film 36, an exposure is carried out through a photomask, the photosensitive ink corresponding to an unexposed region is removed by development, and then the copper foil in the region free from the photosensitive ink is removed by etching to form an electrically conductive pattern acting as a circuit.

In the production of printed wiring boards as described above, a broad plate material is usually used as a substrate. The plate material is subjected to screen printing over the entire surface thereof, and subsequently to the exposure and etching to obtain a multiplicity of printed wiring boards at one time. Thereafter the plate material is cut into printed wiring boards. FIG. 4 shows a broad plate material 40. Screen printing is executed over the entire surface of the plate material 40 to form a photosensitive ink film thereon. In order to cut the plate material 40 into printed wiring boards in a subsequent step, a plurality of regions known as cutting spaces or cutting areas 41 (represented by broken lines) are longitudinally and transversely provided.

When the entire surface of the plate material 40 is subjected to screen printing, however, there arises a problem that the photosensitive ink film is liable to be uneven in thickness. In other words, the photosensitive ink film forms thinner in the region tear the center of the plate material as shown by dashed line hatching 42 in FIG. 4. The thinner film portion thus formed prevents the exposure, development, and etching in later steps from being uniformly performed, which is an obstacle in the manufacture of printed wiring boards.

The present invention was conceived in view of the above disadvantages, and an object is to provide a method of film formation in screen printing wherein a photosensitive ink film having an even thickness can be provided over the entire surface of a broad plate material.

SUMMARY OF THE INVENTION

The present invention is characterized by a method of forming a film in screen printing in which a photosensitive ink is applied through a screen over the entire surface of a plate material to be subjected to cutting so as to obtain a multiplicity of printed wiring boards, said method comprising the steps of forming, on at least one side of said screen, an emulsion pattern corresponding to the cutting spaces of said plate material which exist for obtaining a multiplicity of printed wiring boards, and applying said photosensitive ink over the entire surface of said plate material through said screen having said emulsion pattern provided thereon.

The emulsion pattern provided on the screen functions to disperse the photosensitive ink across the entire surface of the original plate when screen printing onto the original plate, thus forming a photosensitive ink film having an even thickness over the entire surface of the plate material. Also, this emulsion pattern is formed correspondingly to the cutting spaces of the original plate, but not formed in a circuit formation area of the original plate, which would otherwise disturb the circuitry.

DESCRIPTION OF THE PREFERRED EMBODIMENTS

Figure 1:
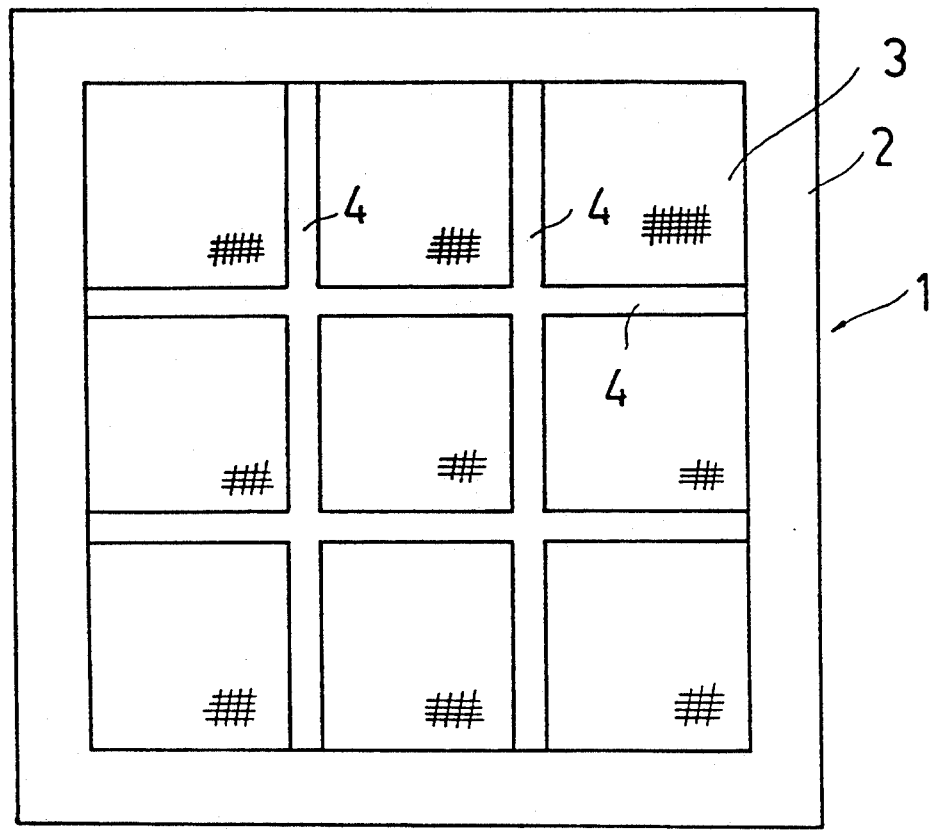
FIG. 1 is a plan view of a screen frame used in the present invention.
Figure 2:
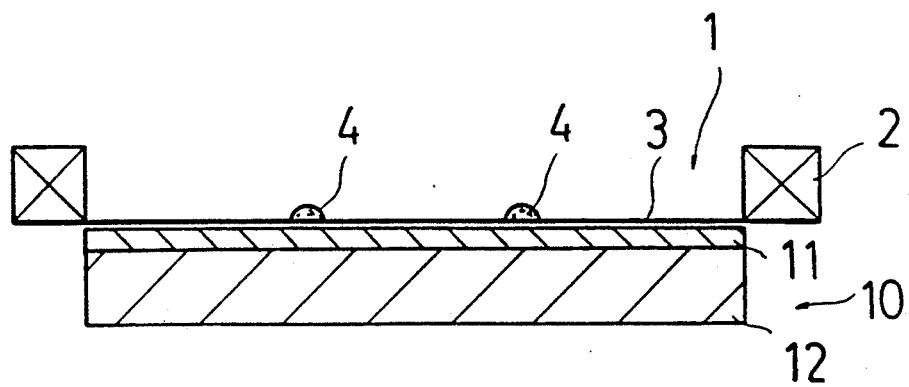
FIG. 2 is a sectional view of a screen frame for use in screen printing.
Figure 3:
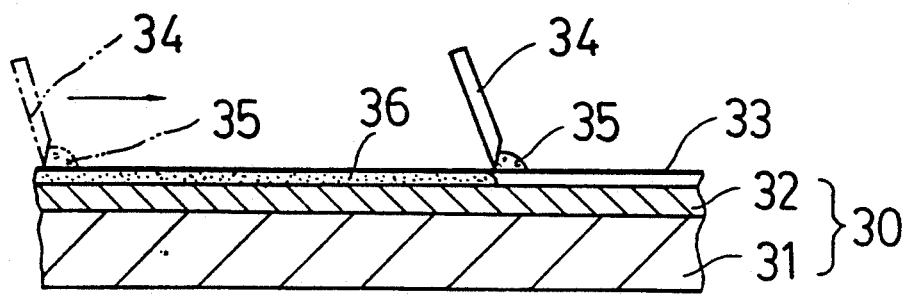
FIG. 3 is a sectional view illustrating screen printing.
Figure 4:
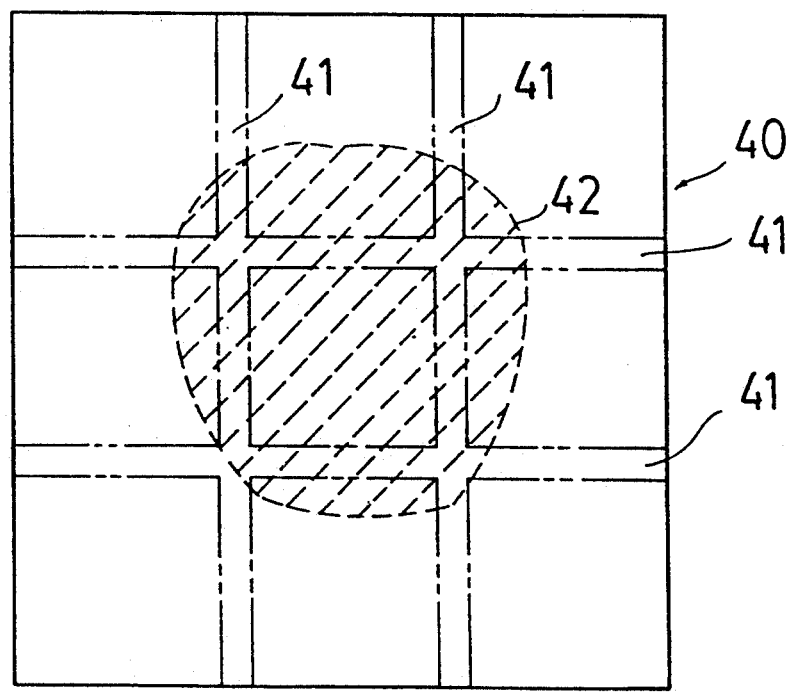
FIG. 4 is a plan view showing a plate material and an uneven film formed on the plate material.

FIG. 1 shows a screen frame 1 used for a film forming method in accordance with the present invention, and FIG. 2 illustrates a state of usage of the screen frame 1. The screen frame 1 includes a rectangular frame body 2 of, for example, aluminum having a screen 3 tightly stretched therearound. The screen 3 is made of cloth formed by meshedly weaving extra-fine threads of polyester, nylon, stainless steel or the like, and is stretched over the frame body 2 under a predetermined tension. As shown in FIG. 2, the screen 3 of the screen frame 1 is set on a wide plate material 10 for use in screen printing with photosensitive ink. The screen 3 of the screen frame 1 has on its top surface emulsion patterns 4 previously formed in both longitudinal and transverse directions. The patterns 4 are formed correspondingly to cutting spaces (designated by reference numeral 41 in FIG. 4) which are designed to obtain a multiplicity of printed wiring boards from the plate material 10. The formation of the patterns 4 is carried out by applying a photosetting or thermosetting emulsion over the entire surface of the screen 3, setting the part of the emulsion corresponding to the cutting space, and removing the remainder of the emulsion by means of development. Alternatively, for a simpler formation of the patterns 4, the emulsion may be applied on the screen along the cutting spaces using a brush or the like, and then set.

Such emulsion patterns 4, which prevent photosensitive ink from oozing through the screen 3 onto the plate material 10 at the time of screen printing, are formed only on the part of the screen 3 corresponding to the cutting spaces of the plate material 10, and is not formed on the part of the screen 3 corresponding to the region of the original plate 10 in which an electrical circuit is formed. The emulsion patterns 4 comprise ink-blocking areas for blocking the transfer of photosensitive ink through the screen 13. Therefore, the application of photosensitive ink onto the circuit formation area of the plate material 10 is not prevented.

The screen frame 1 having the screen 3 on which the emulsion patterns 4 have been formed is set so that the screen 3 faces the plate material 10, and is subjected to screen printing. The plate material 10 comprises an insulating substrate 12 whose top surface is laminated with a conductive copper foil 11. It will be noted that the plate material 10 has a width large enough to be cut into a multiplicity of printed wiring boards. For screen printing, a squeegee (not shown) is slid across the screen, thereby forming a photosensitive ink film on the copper foil 11 of the plate material 10. Upon such film formation, the patterns 4 on the screen 3 serve as a weir or a partition against the flow of photosensitive ink following the squeegee, which causes a dispersing flow in the photosensitive ink. As a result, the photosensitive ink is allowed to evenly disperse over the screen 3, thus forming a film having even thickness across the entire surface of the plate material 10. This contributes to a uniform processing of exposure, development, etching and the like in the subsequent steps. Also, the formation of the patterns 4 corresponding to the cutting spaces of the plate material 10 does not prevent the application of the photosensitive ink onto the circuit formation area of the original plate 10, which enables a smooth formation of the circuit.

In the above-described embodiment, the emulsion pattern 4 is formed on the top surface of the screen 3, but it may be formed on the bottom surface or on both surfaces thereof to provide the same results.

In the present invention, photosensitive ink is subjected to screen printing by the use of a screen having thereon an emulsion pattern previously formed correspondingly to the cutting spaces of the plate material, thereby accurately forming a film with even thickness over the entire surface of the plate material.

What is claimed is:

1. A method of forming a film by screen printing in which a photosensitive ink is applied through a screen over the entire surface of a plate material which is thereafter subjected to cutting to obtain a multiplicity of printed wiring boards, the method comprising the steps of:
   forming on at least one side of said screen an emulsion pattern which corresponds to a pattern of cutting areas on the plate material along which the plate material is to be cut to divide the plate material into a multiplicity of printed wiring boards; and
   applying said photosensitive ink over the entire surface of said plate material through said screen having said emulsion pattern provided thereon to thereby provide an even thickness of said photosensitive ink over surface portions of said plate material which correspond to the multiplicity of printed wiring boards.

2. In a method of forming a multiplicity of printed wiring boards by screen printing a photosensitive ink through a screen over the entire surface of a plate material to be cut into the multiplicity of printed wiring boards, the improvement comprising the steps:
   providing a plate material having a pattern of cutting areas which divide the plate material into a multiplicity of printed wiring board areas;
   providing a screen suitable for screen printing over the plate material;
   forming an emulsion pattern on the screen corresponding to the pattern of cutting areas of the plate material; and
   applying a photosensitive ink over the entire surface of the plate material through the screen having the emulsion pattern formed thereon to thereby provide a photosensitive ink film of even thickness over surface portions of the plate material which correspond to the multiplicity of printed wiring boards.

3. A method according to claim 2; wherein the forming step comprises forming an emulsion pattern on both opposed surfaces of the screen.

4. A method according to claim 2; wherein the forming step comprises forming an emulsion on one of the opposed surfaces of the screen.

5. A method according to claim 2; wherein the step of providing a screen comprises providing a screen frame having the screen stretched therearound.

6. A method according to claim 2; wherein the step of providing a screen comprises providing a cloth screen made of threads selected from the group consisting of polyester, nylon and stainless steel.

7. A method according to claim 2; wherein the forming step comprises forming an emulsion pattern in longitudinal and transverse directions corresponding to the pattern of cutting areas of the plate material.

8. A method according to claim 2; wherein the forming step comprises
   applying a photosetting or thermosetting emulsion over the entire surface of the screen,
   setting a portion of the emulsion which corresponds to the cutting areas, and
   removing the remainder of the emulsion.

9. A method according to claim 8; wherein the remainder of the emulsion is removed by a development process.

10. A method according to claim 2; wherein the forming step comprises applying a photosetting or thermosetting emulsion on the screen at regions corresponding to the cutting areas, and setting the emulsion.

11. A method according to claim 2; wherein the step of providing a plate material comprises providing a plate material comprised of an insulating substrate having a metal foil laminated thereon.

12. A method according to claim 2; wherein the applying step is carried out by squeezing the photosensitive ink through the screen using a squeegee.

13. A method of forming a photosensitive ink film on a plate which is to be thereafter cut into a multiplicity of printed wiring boards, comprising the steps:
   providing a plate having a multiplicity of designated printed wiring board areas separated by a pattern of cutting areas;
   disposing a screen in superposed relation over the plate, the screen having a pair of opposed major surfaces and a pattern of ink-blocking areas formed on at least one of the major surfaces, the pattern of ink-blocking areas corresponding to and overlying the pattern of cutting areas on the plate; and
   applying a photosensitive ink through the screen but not through the ink-blocking areas thereof onto the designated printed wiring board areas of the plate to form a photosensitive ink film on the printed wiring board areas of the plate.

14. A method according to claim 13; including forming a pattern of ink-blocking areas on both major surfaces of the screen.

15. A method according to claim 13; including forming the pattern of ink-blocking areas from one of a photosetting emulsion and a thermosetting emulsion.

16. A method according to claim 15; wherein the forming of the pattern of ink-blocking areas comprises applying the photosetting or thermosetting emulsion over the entire major surface of the screen, setting a portion of the emulsion which corresponds to the ink-blocking areas, and removing the remaining unset portion of the emulsion to thereby form an emulsion pattern of ink-blocking areas.

17. A method according to claim 16; wherein the applying step comprises squeezing the photosensitive ink through the screen using a squeegee.

18. A method according to claim 13; wherein the plate comprises an insulative substrate having a conductive foil laminated thereon, the photosensitive ink being applied on the conductive foil to form thereon the photosensitive ink film.

19. A method according to claim 18; further including cutting the plate along the cutting areas thereof to form a multiplicity of printed wiring boards each having a photosensitive ink film thereon.

20. A method according to claim 13; further including cutting the plate along the cutting areas thereof to form a multiplicity of printed wiring boards each having a photosensitive ink film thereon.

* * * * *